United States Patent
Satoh et al.

(10) Patent No.: US 6,435,196 B1
(45) Date of Patent: Aug. 20, 2002

(54) IMPURITY PROCESSING APPARATUS AND METHOD FOR CLEANING IMPURITY PROCESSING APPARATUS

(75) Inventors: Noritada Satoh; Kouichi Ohira; Bunya Matsui; Kazuo Maeda, all of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/451,706

(22) Filed: Dec. 1, 1999

(30) Foreign Application Priority Data

Aug. 11, 1999 (JP) ............................................. 11-227618

(51) Int. Cl.⁷ ................................................. B08B 6/00
(52) U.S. Cl. ............................ 134/1.1; 216/60; 216/67; 216/68; 216/69
(58) Field of Search ................................ 134/1.1, 22.1, 134/104.1, 166 R; 118/715, 723 E; 216/67, 69, 68, 60; 264/681; 156/345; 315/111.21

(56) References Cited

U.S. PATENT DOCUMENTS 6,209,483 B1 * 4/2001 Dyer ....................... 118/723 R

FOREIGN PATENT DOCUMENTS

| JP | 529285 | 2/1993 |
| JP | 897185 | 4/1996 |
| JP | 2708903 | 10/1997 |

* cited by examiner

*Primary Examiner*—Randy Gulakowski
*Assistant Examiner*—Yolanda Person
(74) *Attorney, Agent, or Firm*—Lorusso & Loud

(57) ABSTRACT

The present invention relates to an impurity processing apparatus in which impurities such as phosphorus, boron, or the like are doped in a semiconductor substrate, etc., or a PSG (PhosphoSilicateGlass) film, a BSG (BoroSilicateGlass) film, or a BPSG (BoroPhosphoSilicateGlass) film, or a carbon film, etc. This apparatus includes a chamber having an introduction port for an impurity-containing ion gas which is connected to an impurity-containing gas supply section, a substrate holder supporting a substrate which is to be ion-injected, or doped, or on which a film is formed using the impurity-containing gas, an introduction port of a water-containing gas which is provided upstream of the substrate holder in accordance with a flow direction of the impurity-containing gas, and is connected to a water-containing gas supply section, and first plasma generating means in a space extending from the introduction port for water-containing gas to the substrate holder for converting water-containing gas to a plasma.

5 Claims, 7 Drawing Sheets

IMPURITY PROCESSING APPARATUS AND METHOD FOR CLEANING IMPURITY PROCESSING APPARATUS

BACKGROUND OF THE INVENTION

1. Field of the Invention

The present invention relates to an impurity processing apparatus for doping impurities such as phosphorus, boron, or the like into a semiconductor substrate, etc., or a PSG (PhosphoSilicateGlass) film, a BSG (BoroSilicateGlass) film, or a BPSG (BoroPhosphoSilicateGlass) film, or a carbon film, etc. and to a method for cleaning the impurity processing apparatus.

2. Description of the Prior Art

In recent years, in manufacturing a semiconductor integrated circuit apparatus of superhigh integration, in the case where a p-type or n-type impurity region is formed in a semiconductor substrate, or in the case where an amorphous boron film or an amorphous carbon film is formed for use in absorption of neutron rays, the following methods have been used: an ion injecting method, a plasma doping method using a parallel plate type electrode, a method employing a wave guide for microwaves ($\mu$ waves) causing ECR (Electron Cyclotron Resonance), or a plasma generating method using a power radiating antenna or the like for generating helicon-plasma, and a plasma CVD (Chemical Vapor Deposition) method using an impurity containing film-forming gas which is converted into a plasma (plasmanized).

FIG. 1 is a side view showing a plasma doping apparatus 101 according to the prior art.

This plasma doping apparatus 101, as shown in FIG. 1, comprises a plasma process part 101A for doping an impurity on a substrate 51 by a plasma gas; and a doping gas supply part 101B having a doping gas source, and a parallel plate type electrode used as a plasma generating source for the plasma process part 101A.

The plasma process part 101A, as shown in FIG. 1, plasmanizes a doping gas and has a process chamber 1 which dopes the substrate 51 by use thereof and can decompress.

The process chamber 1 is connected to an exhaust apparatus 6 through an inducting/exhausting piping 8a. An upper electrode 2a and lower electrode 2b opposing each other are provided in the process chamber 1, and power is supplied from a power supply 5, i.e., DC (a direct current), AC (an alternating current (frequency 50 Hz or 60 Hz)), LF (low frequency (frequency 100 to 800 kHz) or RF (radio frequency (frequency 1 to 25 MHz)) power, to these electrodes 2a, 2b, and the doping gas is thereby plasmanized. The upper electrode 2a, the lower electrode 2b and the power supply 5 constitute the plasma generating means for plasmanizing the doping gas.

The upper electrode 2a serves as a dispersion member for the doping gas and is provided with a discharge port 3 for the doping gas. The discharge port 3 for the doping gas is connected to a doping gas supply part 101B via piping 8b.

The lower electrode 2b serves also as a holding base for the substrate 51, and a heater 4 for heating the substrate 51 is provided under the lower electrode 2b.

Gas bombs 7 for supplying the doping gas are installed in the doping gas supply part 101B. The doping gas is supplied from these gas bombs 7 to the process chamber 1 of the plasma process part 101A through pipings 8c, 8d, 8b.

In this plasma doping apparatus, if used repeatedly for a long period of time, a decomposed product of a gas containing an element to be doped adheres to an inner wall of a partition surface of the chamber 1 and surfaces of the electrodes 2a, 2b for generating a glow discharge, etc. Such circumstances also occur even in an ion implantation system or a plasma CVD apparatus.

If the insulating decomposed product accumulates on the surfaces of the electrodes 2a, 2b for generating the glow discharge, charge-up occurs to destabilize the glow discharge. Furthermore, in an apparatus using the ECR, a glass surface of a window for introducing $\mu$ waves into a plasma generating chamber is contaminated, and the decomposed product accumulates even on the inner wall of the plasma generating chamber thereby lowering plasma generating efficiency.

If such a state continues, the discharge becomes unstable and difficult to use. Furthermore, in the worst case, the discharge stops and cannot be used.

Additionally, when a weak p type or n type is doped, the decomposed product containing doping impurities which adhere to the inner wall of the chamber sputter and adhere to the semiconductor substrate, and it becomes difficult to perform lower concentration doping. Accordingly, in order to dope with excellent reproducibility, removal of the decomposed product adhered to the inner wall of the chamber is necessary.

Normally, the following methods are used for cleaning an interior of the chamber of such processing apparatus:

(i) a method glow-discharging for at least an hour in a gas such as argon or hydrogen. As a method for cleaning an inner wall of an ion source housing of an ion implantation system, a method for using hydrogen or an alkyl based substance is disclosed in Japanese Application Laid-Open No. 3-64462, for example.

(ii) a method in which, after a device is disassembled and each part is dipped in a mixture of, for example, a hydrogen peroxide solution and ammonia water, contaminants are manually shaved off by mechanical use of sandpaper or a wire brush, and after cleaning the apparatus, it is reassembled and used.

(iii) a method for cleaning the path of ion beams of the ion implantation system, a method for vaporizing a reaction product adhered to an inner wall, etc. by glow discharge of an oxygen containing gas such as $O_2$, $O_3$ or the like, or a halogen fluoride gas such as $CF_4$, $C_2F_6$, $NF_3$ or the like and cleaning is disclosed in Japanese Application Laid-Open No. 4-112441, for example. Furthermore, an example of use of a halogen fluoride gas such as $ClF_3$ or the like is disclosed in Japanese Application Laid-Open No. 8-162433.

However, there are the following drawbacks in a conventional method for cleaning an impurity processing apparatus: Namely, (i) in the method for glow-discharging in a gas such as argon or hydrogen, in the case of argon, an impurity layer adhered to a surface of a silicon substrate is removed, but upon a removal from the surface of the silicon substrate, these impurity atoms invade into the silicon substrate. Furthermore, the material forming the inner wall of the reaction apparatus is sputtered and adheres to the surface of the silicon substrate and invades the substrate, so that it may adversely affect its characteristics.

In the case of hydrogen, for example, when boron is present, a reaction product of boron and hydrogen is generated, and when the reaction chamber is opened to the outside air, diborane is released which is unfavorable for human health. Moreover, if a glow discharge continues for about an hour, a roughness occurs on a surface of the silicon substrate. Furthermore, if the adhered substance starts to be partially removed in the argon or hydrogen, the discharge concentrates on that part and a roughness occurs on the inner wall of the apparatus, the electrode surface and the surface of the silicon substrate. With the other gases, as an adhesive substance is scarcely removed in helium, it is not practical. (ii) the method for disassembling a apparatus and cleaning it chemically with chemicals, or mechanically by a wire brush, etc., takes much labor and time for a slight regulation or recovery of a vacuum after reassembly. Furthermore, a doping impurity element may adhere to a human body or be breathed in, so that this method is inconvenient for reasons of health. (iii) in the method for vaporizing a reaction product adhered to the inner wall, etc., by glow discharge of a halogen fluoride gas such as $ClF_3$, $CF_4$, $C_2F_6$ or the like and cleaning, a decomposition product of Cl or F is generated and caution in handling these chemicals is necessary and a great expense is incurred for a public nuisance countermeasure for a rendering harmless this exhaust gas, etc. As the adhesive substance is scarcely removed in the other gases, for example oxygen, it is not practical.

SUMMARY OF THE INVENTION

It is an object of the present invention to provide an impurity processing apparatus which has no problems in operability or health in cleaning of the apparatus, and which can be simply cleaned; and a method for cleaning the impurity processing apparatus.

In the impurity processing apparatus of the present invention, a gas containing any one element selected from the group consisting of boron, phosphorus, arsenic, gallium, aluminum, germanium and carbon, or a gas containing a compound of at least one of these elements is used as an impurity-containing gas. Suitable gases include diborane ($B_2H_6$), boron trifluoride ($BF_3$), etc., as a compound containing boron (B), phosphine ($PH_3$), etc., as a compound containing phosphorus (P), arsine ($AsH_3$), etc., as a compound containing arsenic (As), trimethylgallium (TMG), etc., as a compound containing gallium (G), trimethylaluminum (TMAl), etc., as a compound containing aluminum (Al), germane ($GeH_4$), germanium tetrafluoride ($GeF_4$), etc., as a compound containing germanium (Ge), and methane ($CH_4$), etc., as a compound containing carbon (C). The impurity-containing gas used in actual practice, the gas containing the element or compound thereof is diluted by hydrogen (H) or helium (He).

In the case where ion injection, doping or a film formation is performed by using such gases, for example, in the case of diborane, a by-product containing boron adheres to an inner wall of a chamber or to a silicon surface.

In the prior art, hydrogen or a halogen fluoride gas has been used as a cleaning gas for removing this byproduct. On the contrary, the present invention is characterized in that plasma of water vapor or a water containing carrier gas is used for removing the by-product. If plasma of water vapor, etc., is used, as compared with the case where hydrogen, etc. are used, the by-product is removed by glow discharging for a period of time of about $\frac{1}{10}$. Moreover, a mirror surface of the silicon does not become rough, and it retains its mirror surface state.

In the case where the water vapor, etc., is used, the following reasons explain why the removal rate is 10 times or more higher than the case where hydrogen, etc., is used.

When water is decomposed, it is dissociated into $H^+$ and $OH^-$:

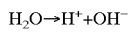

An impurity adhered after the doping process reacts with these $H^+$ and $OH^-$ ions to form BH, PH, AsH, SbH, etc., and is removed from the inner wall of the chamber. When a plasma luminous spectrum produced by glow discharge in the water vapor is observed, OH in addition to H is observed and simultaneously BH, PH, etc., are seen. Such results indicate that, if OH generates, it reacts with a product containing impurities which adheres to the inner wall, etc., of the process chamber after the doping process, to form a hydride of the impurities.

DESCRIPTION OF THE PREFERRED EMBODIMENT

Hereinafter, various embodiments of the present invention will be described with reference to the accompanying drawings.

[First Embodiment]

Figure 1:
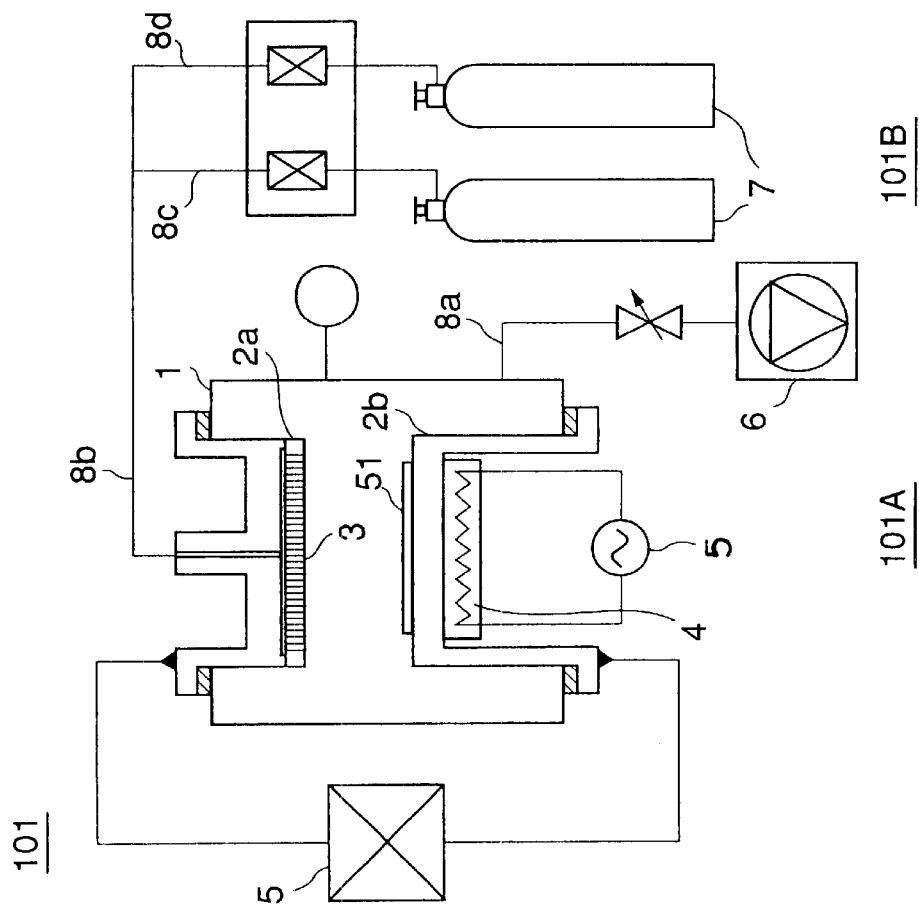
FIG. 1 is a side view of a conventional impurity processing apparatus.
Figure 2:
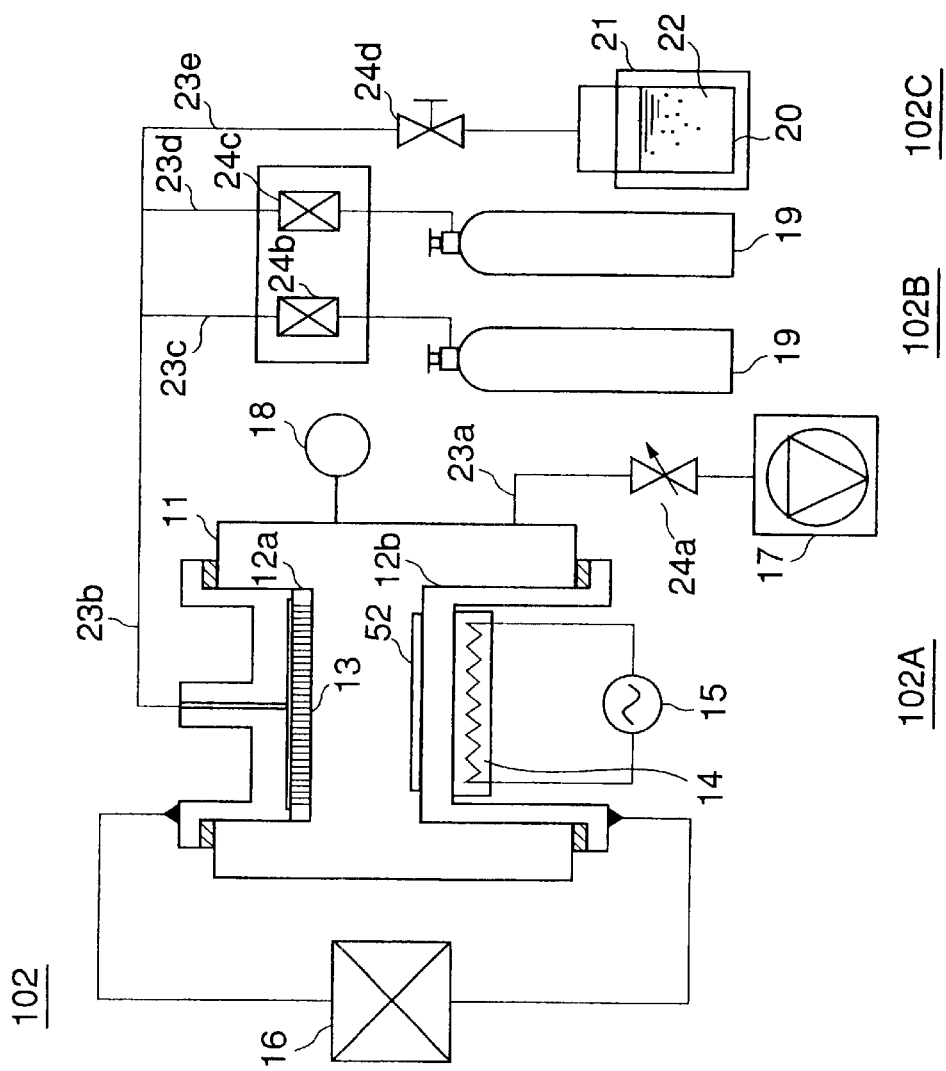
FIG. 2 is a side view of an impurity processing apparatus according to a first embodiment of the present invention.

FIG. 2 is a side view showing a structure of a plasma ion doping apparatus (an impurity processing apparatus) 102 according to a first embodiment of the present invention.

This plasma doping apparatus 102 comprises a plasma process section 102A for doping an impurity on a substrate 52 to be processed by a plasma gas; a doping gas supply section (an impurity containing gas supply) 102B having a doping gas (an impurity-containing gas) source; and a water-containing gas supply section 102C for generating a water-containing cleaning gas, and a parallel plate type electrode used as plasma generating means in the plasma process section 102A.

The plasma process section 102A, as shown in FIG. 2, plasmanizes a doping gas and has a process chamber 11 which dopes the substrate 52 by use thereof and can decompress.

The process chamber 11 is connected to an exhaust apparatus 17 through an inducting/exhausting piping 23a. There is provided a open/close valve 24a for controlling communication/non-communication between the process chamber 11 and the exhaust apparatus 17 midway of the piping 23a. There is provided pressure measuring means 18, such as a vacuum gauge or the like, for monitoring pressure of the interior of the process chamber 11.

An upper electrode 12a and a lower electrode 12b opposing each other are provided in the process chamber 11, and power is supplied from a power supply 16, i.e., DC (a direct current), AC (an alternating current (frequency 50 Hz or 60 Hz)), LF (low frequency (frequency 100 to 800 kHz) or RF (radio frequency (frequency 1 to 25 MHz)), to these electrodes 12a, 12b, and the doping gas or the water-containing gas is plasmanized. The upper electrode 12a, the lower electrode 12b and the power supply 16 constitute second plasma generating means for plasmanizing the doping gas, and also constitute first plasma generating means for plasmanizing the water-containing gas.

The upper electrode 12a also serves as a dispersion member for the impurity-containing gas. A plurality of through holes are formed in the upper electrode 12a and an opening of the through hole on a face opposing the lower electrode 12b is set as a discharge port (an introduction port)13 for the doping gas or water-containing gas. This discharge port 13 for the doping gas, etc., is connected to the doping gas supply section 102B and the water-containing gas supply section 102C via the piping 23b.

The lower electrode 12b serves also as a holder for the substrate 52, and a heater 14 for heating the substrate 52 is provided under the lower electrode 12b. The heater 14 generates heat by supply of electric power from the power supply 15.

A gas bomb 19 for supplying the doping gas such as diborane ($B_2H_6$), phosphine ($PH_3$), etc., is installed in the doping gas supply section 102B. The doping gas is supplied from these gas bombs 19 to the process chamber 11 of the plasma process section 102A through pipings 23c, 23d, 23b. Two gas bombs 19 are shown connected in FIG. 2, but can be increased in number when another doping gas is necessary. Gas controlling means 24b, 24c include flow rate regulating means, opening/shutting means or the like midway of the pipings 23c, 23d extended from each gas bomb 19.

The water-containing gas supply section 102C has a water-containing gas making apparatus for generating water vapor. The apparatus comprises a water container 20 for holding water 22, a heater 21 for heating the water 22, and a piping 23e for conveying the water to the process chamber 11. Gas controlling means 24d, 24e including flow rate regulating means, opening/shutting means or the like, are installed midway of each of the pipings 23e, 23f, respectively.

Figure 3:
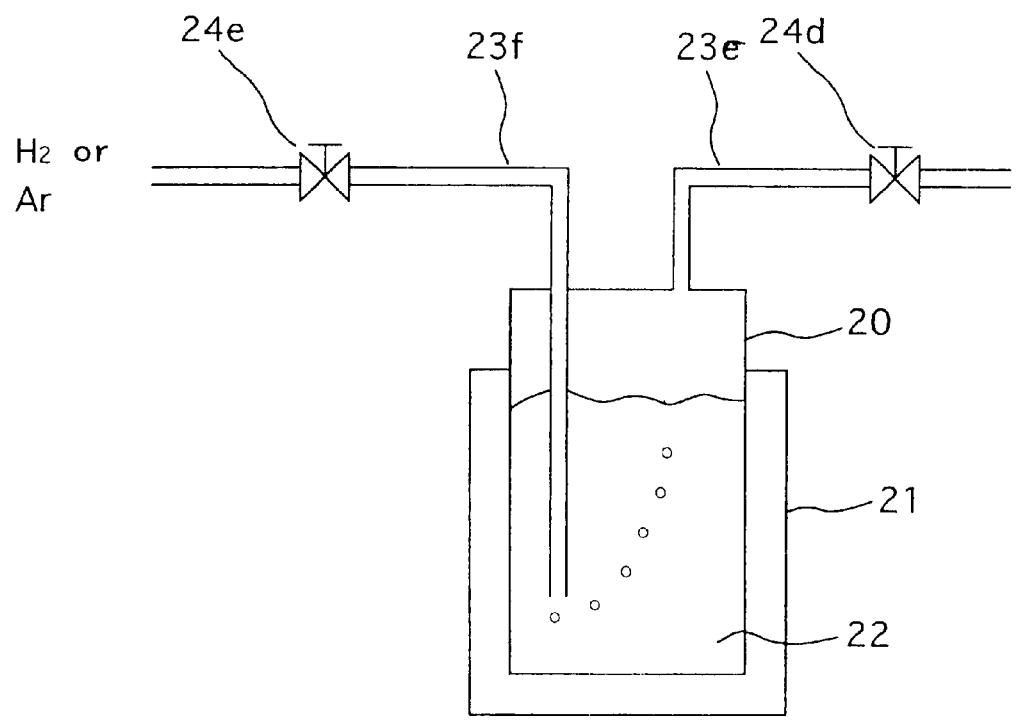
FIG. 3 is a side view of a water-containing gas supply part of FIG. 2.

Alternative water-containing gas devices 102C may be used. For example, FIG. 3 is a side view showing another structure for the water-containing gas supply part 102C in FIG. 2. As shown in FIG. 3, a piping 23f for conducting a carrier gas is inserted into the water 22 in the water container 20, and the water can be vaporized into the carrier gas. Hydrogen ($H_2$), argon (Ar), or the like can be used as the carrier gas. Further, the water vapor generated by heating water may be mixed with a hydrogen gas ($H_2$) or an argon (Ar) gas.

The plasma doping apparatus 102 described above comprises, in addition to the structure necessary for normal plasma doping, a discharge port 13 for a water-containing gas, provided upstream of substrate holder 12b in the flow direction of the doping gas; and first plasma generating means 12a, 12b, 16 for plasmanizing the water-containing gas across a space extending from the discharge port 13 of the water-containing gas to the substrate holder 12b.

Incidentally, in the case of the first embodiment, 20 the discharge port 13 of the water containing gas is provided in furthest upstream position relative to the first plasma generating means 12a, 12b, 16, and if the water-containing gas is introduced therefrom, it can be plasmanized effectively. Furthermore, the substrate holder 12b is provided in a lowermost downstream position relative to the first plasma generating means 12a, 12b, 16, and the plasma gas effectively reaches the substrate 52.

Accordingly, even if, after completion of the plasma doping, a by-product or a residue containing impurities exists in the chamber 11, it is possible to generate plasma of the water-containing gas. in the flow path of the doping gas. Hydrogen (H) or hydroxyl group (OH) in the plasma of the water-containing gas forms a hydride by reaction with the impurity residue. Furthermore, it is considered that the hydroxyl group (OH) promotes the reaction, and it is possible to remove the by-product or residue containing the impurity from the interior of the chamber 11 within a shorter period of time than in the prior art.

A method for plasma-processing the substrate 52 by use of the above plasma doping apparatus 102 and continuously cleaning the interior of the plasma doping apparatus 102 will now be described below.

Figure 4A:
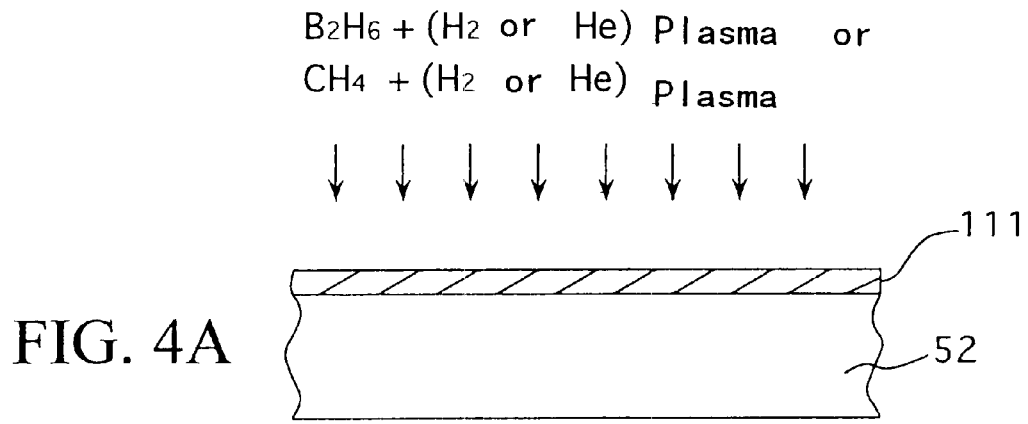
FIG. 4 is a cross-sectional view showing a method for forming a film by an impurity-containing gas and then cleaning by using the impurity processing apparatus of FIG. 2.
Figure 4B:
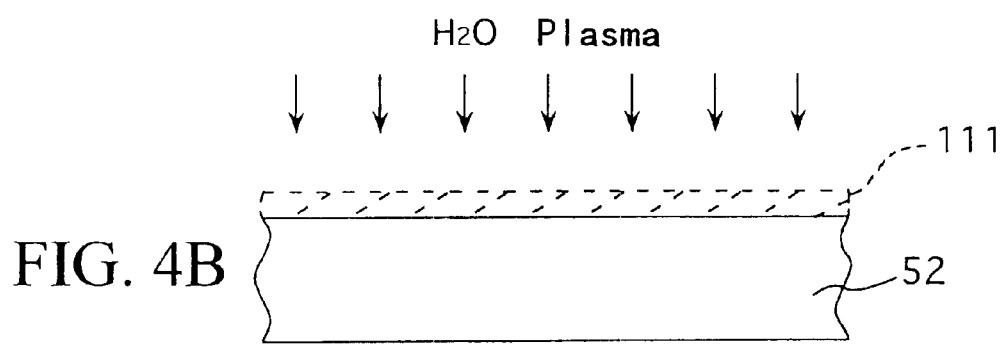
Figure 4C:

In order that the effects can experimentally and readily be confirmed, the experiment was carried out in the steps shown in FIGS. 4A to 4C. In this case, the plasma doping apparatus 102 is used as a film forming apparatus. Then, the impurity-containing gas containing boron or carbon is used as a film formation gas, to thereby form an amorphous boron film or an amorphous carbon film 112.

First, as shown in FIG. 4A, the silicon substrate (a to-be-processed layer) 52 is mounted on the lower electrode 12b in the process chamber 11 shown in FIG. 2. Successively, the impurity-containing gas is supplied into the process chamber 11, and pressure in the process chamber 11 is held at about 1 Torr. In this case, when an amorphous boron film 111 is formed, a gas in which diborane ($B_2H_6$) is diluted to about 1000 ppm by hydrogen or helium is used as the impurity-containing gas, or when the amorphous boron film 111 is formed, a gas in which methane ($CH_4$) is diluted to about 1000 ppm by hydrogen or helium is used.

Next, electric power is supplied from a DC, AC, LF or RF power supply 16 between the upper electrode 12a and the lower electrode 12b, and is applied to the impurity-containing gas between upper electrode 12a and the lower electrode 12b. Thus, the impurity containing gas is plasmanized and a surface of the silicon substrate 52 is exposed to this plasma. After a specified period of time, an amorphous boron film or amorphous carbon film 111 of a film thickness about 1 $\mu$m is formed on the silicon substrate 52. This is used as a cleaning sample.

Next, as shown in FIG. 4B, after the impurity containing gas is stopped and pressure in the process chamber 11 is set to about $10^{-3}$ Torr, water vapor is introduced into the process chamber 11, and the pressure is held at 1 Torr. Electric power is continuously supplied from the DC, AC, LF or RF power supply 16, and is applied to the water vapor between the upper electrode 12a and the lower electrode 12b, to thereby cause a glow discharge. In the case of DC, a discharge voltage is set to about 500 V, or in the case of AC, the discharge voltage is set to 400 V, or in the case of LF and RF, the applied power is set to 100 to 1000 W. Thus, the water vapor in the process chamber 11 is plasmanized and the amorphous boron film or amorphous carbon film 111 is exposed to this plasma.

If this state is held for a specified period of time, as shown in FIG. 4C, the amorphous boron film or amorphous carbon film 111 is removed.

According to the experimental results, in the case of DC (a discharge voltage 590 V, a discharge current 0.27 A, corresponding to substantially 160 W), AC (a discharge voltage 540 V, a discharge current 0.3 A, corresponding to substantially 160 W), or LF and PF, the amorphous boron film or amorphous carbon film 111 of a film thickness 0.3 to 1 $\mu$m is approximately completely removed within about 10 to 20 min. Moreover, a surface of the silicon substrate 52 maintained a mirror surface state. Roughness of the surface in the case where hydrogen or argon was used as a cleaning gas was not observed.

From the viewpoint of the aforementioned experimental results, it is acknowledged that it is possible to remove by-products adhered to the inner wall of the process chamber 11 or the surface of the electrodes 12a, 12b by the process employing the water vapor plasma. Actually, when making experiments under the same discharge conditions as above, it is possible to remove even the by-products of a film thickness several 1 μm for a short period of time which is 1 to 10 hours. It is, in particular, considered that this is due to the roughness and porosity the film of the by-product adhered to the inner wall, etc.

Incidentally, in the case where a phosphorus compound such as phosphine or the like is used as the impurity-containing gas, an experiment with film formation was not made as a thin film of phosphorus is not formed, but after exposure to the plasma of phosphine or the like, the interior of the process chamber 11 was treated by the plasma of the water vapor under the same conditions as above. Then, even if the process chamber 11 is opened, offensive odor of the phosphorus compound is not detected. Furthermore, a gas in the interior of the process chamber 11 was analyzed by PID (Photo Ionization Detector), but $PH_3$ was not detected.

As described above, according to the first embodiment of the present invention, after treatment with a plasma of boron, carbon or phosphorus was performed, treatment with a plasma of the water vapor or the water-containing gas was performed, whereby it is possible to remove by-products generated in the process chamber 11 or residues containing phosphorus, etc., from the interior of the process chamber 11 within a short period of time without damaging the inner wall, etc., of the apparatus.

Incidentally, in the above description, a compound of boron, carbon or phosphorus is used as the impurity, but the elemental form may be used. Furthermore, diborane ($B_2H_6$) is used as the compound of boron, but other compounds, for example, boron trifluoride ($BF_3$) can be also used. Methane ($CH_4$) is used as the compound of carbon, but the other compounds can also be used. Phosphine ($PH_4$) is used as the compound of phosphorus, but other compounds can also be used.

Furthermore, the other impurity, for example, elemental arsenic, gallium, aluminum or germanium or a compound containing same can be used. Arsine ($AsH_3$) is typical as the compound of arsenic and trimethylgallium (TMG) is typical as the compound of gallium, and in the case of the compound of aluminum, trimethylaluminum (TMA1) is typical, and in the case of germanium, germane ($GeH_4$) or germanium tetrafluoride ($GeF_4$) is typical.

Furthermore, when a partition wall of the process chamber 11 is formed of aluminum, if the by-product is removed only by the water vapor as described above, as an alumina film is formed on the inner wall of the process chamber 11 or the surface of the electrode, an abnormal discharge due to charge-up easily occurs. Then, the water vapor is mixed with hydrogen or an argon gas. In this case, it is preferable that hydrogen or argon gas is added to the water vapor in the amount of about 50% by volume. Alternatively, hydrogen or an argon gas is bubbled through water, and a glow discharge is caused under the above-described conditions by use of hydrogen or the argon gas containing water. As the alumina film is not formed by adding hydrogen or the argon gas thereto, a stable discharge can be attained.

[Second Embodiment]

Figure 5:
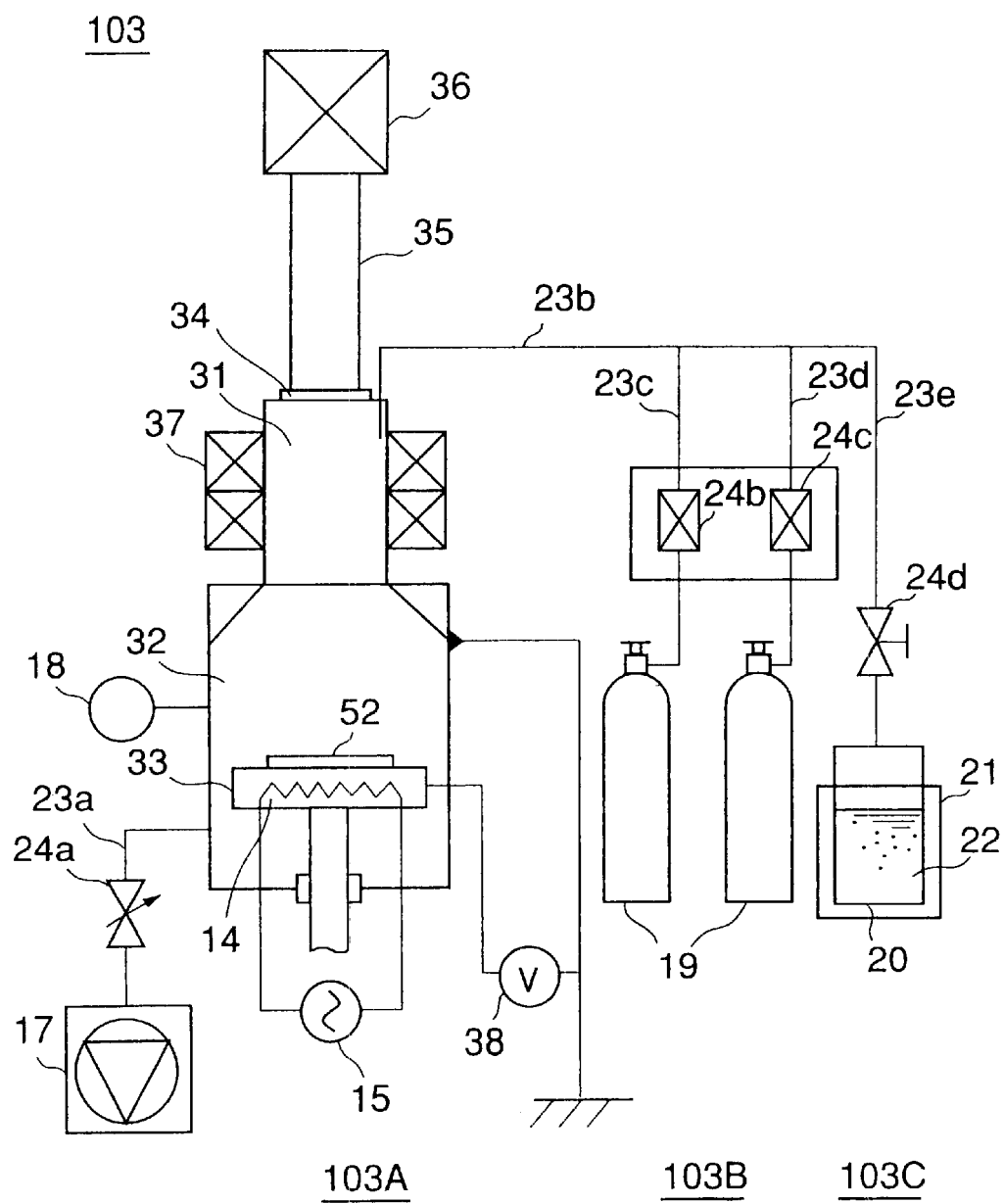
FIG. 5 is a side view of an impurity processing apparatus according to a second embodiment of the present invention.

FIG. 5 is a side view showing structure of a plasma doping apparatus (an impurity processing apparatus) 103 according to a second embodiment of the present invention. As the structure of the water-containing gas source 103C in FIG. 5 is same as in FIG. 2, the description is omitted.

FIG. 5 is a plasma doping apparatus (an impurity processing apparatus) having plasma generating means for ECR (Electron Cyclotron Resonance), and FIG. 5 is different from FIG. 2 in that a plasma generator 31 is separated from a plasma generator 32 and microwaves (frequency 2.45 GHz) are used as plasma generating means. Incidentally, even in this case, a plasma doping apparatus 103 can be used as a film forming apparatus.

Hereinafter, an apparatus according to the second embodiment will be described with reference to FIG. 5.

Similar to the apparatus structure of FIG. 2, the apparatus according to the second embodiment comprises a plasma process section 103A; an impurity-containing gas supply section 103B; and a water-containing gas supply section 103C. As the impurity-containing gas supply section 103B and the water-containing gas supply section 103C have the same structure as in FIG. 2, the description is omitted. Additionally, in the case of reference numerals in FIG. 5 like or similar to those in FIG. 2, the description is omitted.

The plasma process section 103A comprises the plasma generator section 31 and the plasma generator 32, and is partitioned from an external unit by a partition wall.

A piping 23b extending from the impurity-containing ion gas supply section 103B and the water-containing gas supply section 103C is connected to the furthest upstream part of the plasma generator 31, with the result that an impurity-containing gas or a water-containing gas is introduced thereinto. Furthermore, at the upstream side is connected a wave guide 35 of microwaves via a glass plate 34, and a microwave power source of frequency 2.45 GHz is introduced from a power supply 36 to the plasma generation section 31. Furthermore, a coil 37 for generating a magnetic field is provided around the outer periphery of the plasma generation section 31, and electron cyclotron resonance (ECR) is caused by the microwave power and the magnetic field to convert the impurity-containing gas or water-containing gas to a plasma.

The plasma forming section 32 comprises a substrate holder 33, and a power source 38 is connected between the partition wall enclosing the plasma forming section 32 and the substrate holder 33, so that a voltage can be applied to therebetween. This voltage biases the substrate holder 33 at a negative voltage to accelerate ions.

As described above, the plasma doping apparatus 103 s according to the second embodiment comprises not only a structure necessary for the standard plasma doping but also the water-containing gas supply section 103C; further an introduction port for introduction of a water-containing gas is provided in a position upstream of the substrate holder 33 in accordance with flow direction of the impurity-containing gas; and first plasma generating means 35, 36, 37 is provided in a space between the introduction port for the water-containing gas and the substrate holder 33 for converting the water-containing gas to a plasma.

That is, the plasma generation section 31 is separated from the plasma generating section 32, but since the second embodiment has a structure similar to the first embodiment, the second embodiment has effects similar to those of the first embodiment.

[Third Embodiment]

Figure 6:
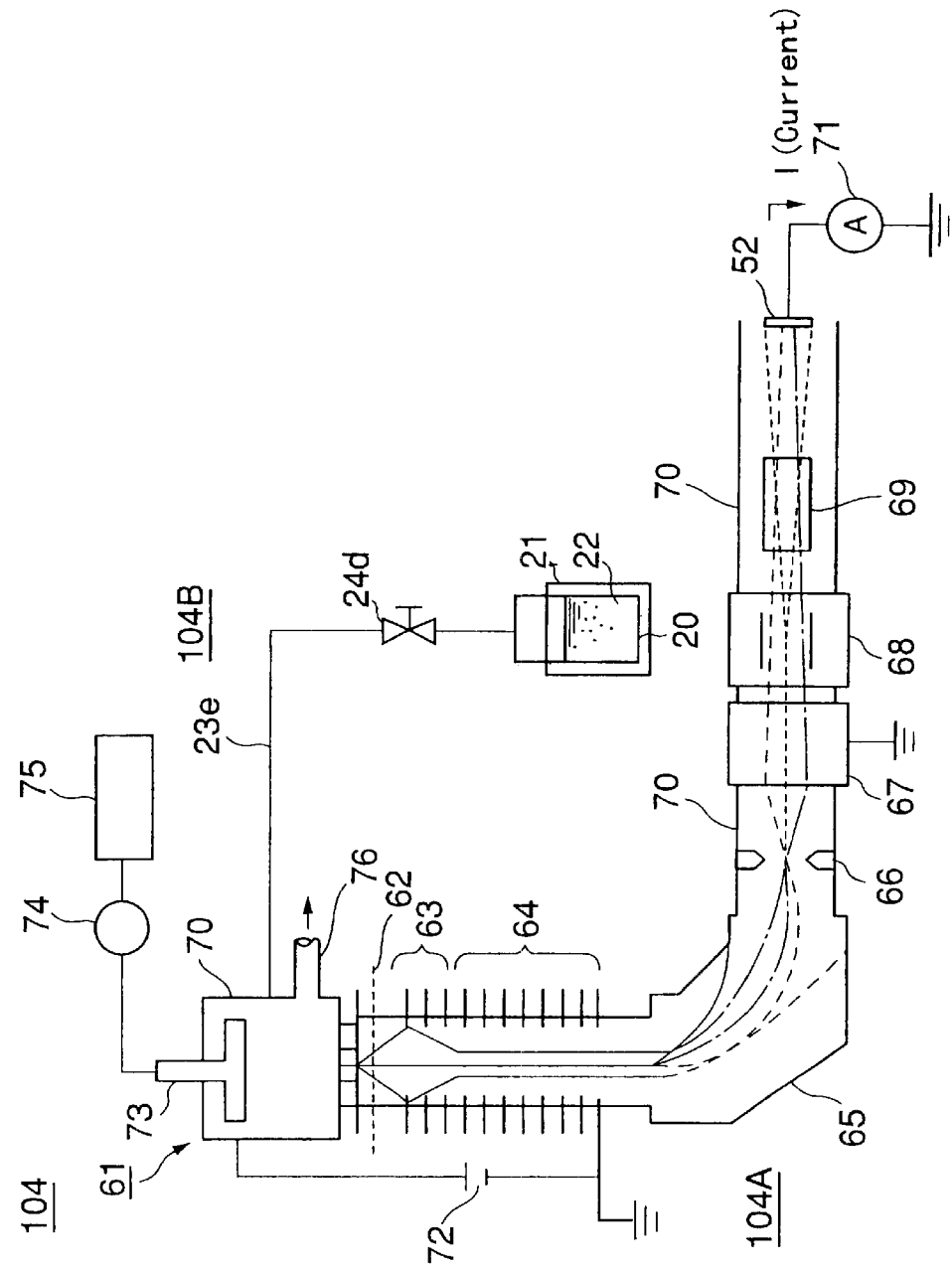
FIG. 6 is a side view of an ion implantation system according to a third embodiment of the present invention.

FIG. 6 is a side view showing a structure of an ion implantation system (an impurity processing apparatus) 104 according to a third embodiment of the present invention. As the structure of the water-containing gas supply part 204B in FIG. 5 is same as that in FIG. 2, the description is omitted.

In FIG. 6, the third embodiment has not only an ion injection part 104A having a apparatus structure necessary for a standard ion injection, but also a water-containing gas supply section 104B for supplying water vapor, etc.

First, the ion injection section 104A has an apparatus structure necessary for a standard ion injection. That is, an ion source housing (an impurity-containing gas supply section) 61 which is an ion source; an ion producing electrode 62; a lens 63; an acceleration electrode 64; a mass analyzer 65; a mass selector slit 66; an electrostatic quadrupole lens 67; a scan electrode 68; and a 7° deflector neutron trap 69, in accordance with flow direction of an ion beam (an impurity containing gas). These are enclosed by a partition wall 70. A substrate 52 is set in a lowermost downstream position to inject ions. The substrate 52 is connected to an ammeter 71 for measuring current, thereby monitoring a dose.

The ion source housing 61 is provided with an introduction port for introduction of an ion source (not shown) and further an exhaust port 76 is connected to an exhaust apparatus for decompressing the interior of the ion source housing 61, and the interior of the ion source housing 61 is regulated at an appropriate pressure. Furthermore, the ion source housing 61 is provided with an ion source electrode (second plasma generating means) 73 which is an electrode on one side of the electrodes which ionize an ion source, and this ion source electrode 73 is connected to a power supply 75 and a matching box 74. A voltage is applied between this ion source electrode 73 and the partition wall 70 to plasmanize the ion source. Furthermore, this ion source electrode 73 serves both as an electrode for generating an electric field for accelerating ions relative to an acceleration electrode 64, and as a power supply 72 for supplying a DC voltage and is connected across a space between the ion source electrode 73 and the acceleration electrode 64.

The water-containing gas supply section 104B has a generating apparatus which has structure similar to that in FIG. 2 and generates a water vapor, etc., and piping 23e extends from this generating apparatus to the ion injection section 104A. The piping 23e is connected to the ion source housing 61 in an uppermost upstream position for cleaning the ion injection section 104A, and functions as an introduction port for a water-containing gas, etc. Namely, the introduction port for the water-containing gas, etc. is connected to the plasma generating section for plasmanizing the ion source.

The ion injection section 104A serves both as the apparatus structure necessary for standard ion injection and as a cleaning electrode (first plasma generating means) for plasmanizing the water-containing gas, etc. by the ion source electrode 73. Namely, the ion source electrode 73 is provided at the same position as the introduction port of the watercontaining gas. DC, AC, LF or RF power can be applied between this ion source electrode 73 and the partition wall 70. Incidentally, the introduction port for the water-containing gas may be provided upstream of the ion source electrode 73.

When the ion injection section 104A is purified after the ion injection, the watercontaining gas is introduced into the ion source housing 61 and plasmanized, to thereby purify each position in the ion source housing 61 and the downstream ion injection section 104A.

As described above, the ion implantation system 104 according to the third embodiment comprises not only structure necessary for a standard ion injection but also first plasma generating means 73, 74, 75 containing the cleaning electrode 73 for plasmanizing the water-containing gas, which is provided with an introduction port for a water-containing gas at positions necessary for cleaning or upstream thereof. Means 73, 74 and 75 are located at positions which are same as those of the introduction port of the water-containing gas and necessary for cleaning, or upstream thereof.

That is, as the ion implantation system 104 according to the third embodiment has the same structure as in the first embodiment, it has the same effects as the first embodiment.

As described above, the present invention was set forth in detail according to the embodiments, but the scope of the present invention is not limited to the aforementioned embodiments, and modification of the aforementioned embodiments within a scope not deviating from the gist of the present invention is considered within the scope of the present invention.

For example, in the first and second embodiments, the plasma processing apparatus is used as a apparatus for forming the amorphous boron film or the amorphous carbon film, but it is possible to also use it as the plasma doping apparatus by changing the impurity-containing gas. In this case, as the plasma generating means for the water containing gas is located at positions where the doping gas is plasmanized, or at the same positions as the doping positions, or upstream thereof, the interior of the plasma generation chamber or the doping chamber is cleaned by converting the water-containing gas to a plasma after doping, and it is possible to remove products or residues containing boron, carbon, etc.

Furthermore, according to the first embodiment, the introduction port for the water-containing gas is common to the introduction port of the impurity-containing gas, but they may be separately provided. In this latter case, the introduction port for the water-containing gas is provided at the same position as in the plasma generating means, and may be provided at positions where the water-containing gas is plasmanized so that the plasma effectively reaches the substrate. Alternatively, the introduction port for the water-containing gas may be provided upstream of the plasma generating means.

Figure 7:
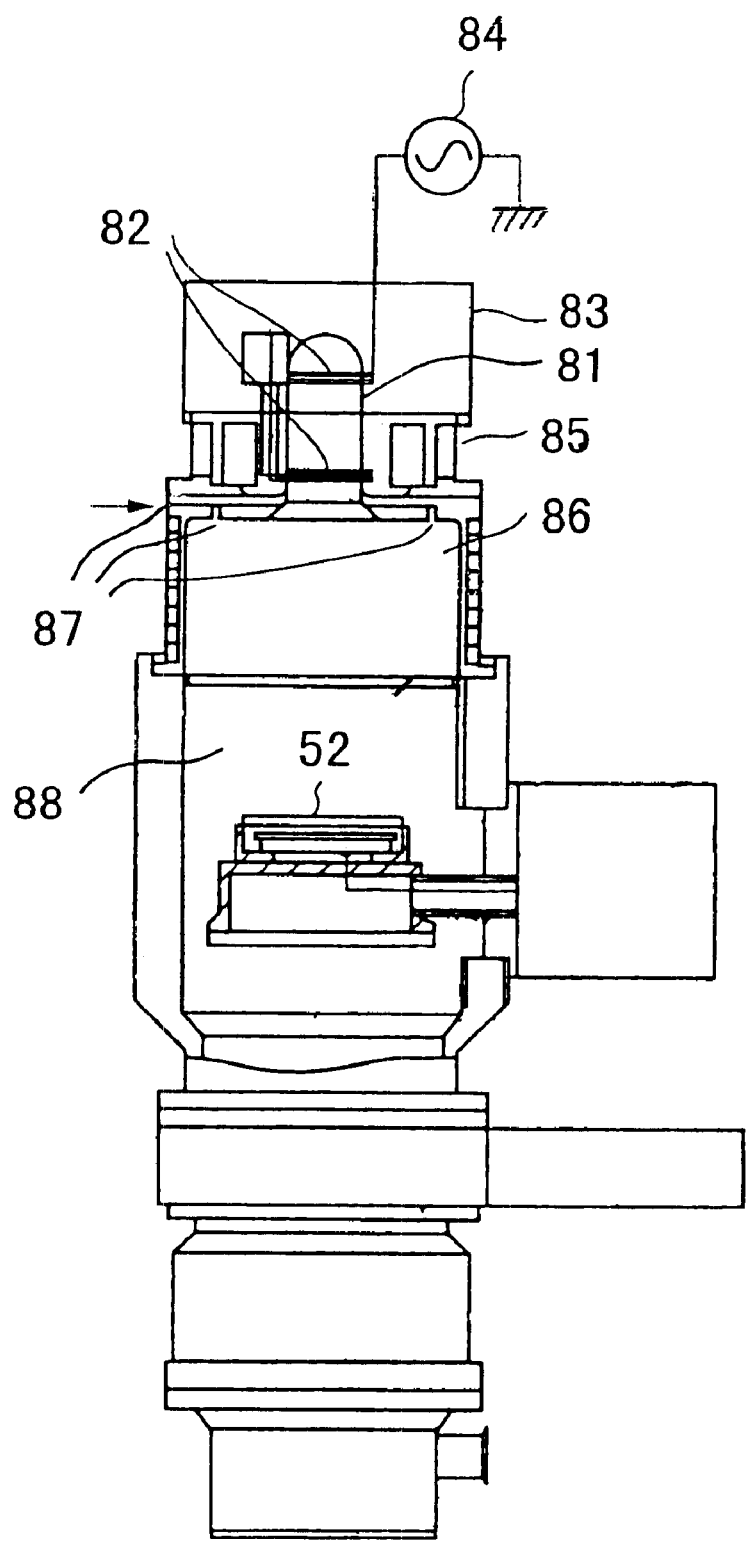
FIG. 7 is a side view of an impurity processing apparatus according to a fourth embodiment of the present invention.

Though means 12a, 12b, 16 are used for applying a voltage between a pair of electrodes 12a, 12b of parallel plate type to generate a plasma, means 35, 36, 37 may generate the plasma by electron cyclotron resonance, or means for applying a voltage between the partition wall 70 of the chamber and the electrode 73 may be used to generate the plasma as the first plasma generating means 12a, 12b, 16, 35, 36, 37, 73 in the above embodiment. Means for generating a helicon plasma by application of an electromagnetic field from an antenna may also be used as shown in FHG.7. The means for generating the helicon plasma comprises an antenna 82 around a plasma generating chamber 81, a radio frequency (13.56 MHz) power supply 84 connecting the antenna 82 through a matching box 83, and a magnet 85. In addition, the symbol 88 in FIG. 7 indicates a processing chamber, the symbol 86 indicates a regulating chamber effecting communication between the plasma generating chamber 81 and the processing chamber 88 and regulating plasma distribution in the chamber 86, the symbol 87 indicates processing gas for introduction ports introducing an impurity-containing gas or a water-containing gas.

As described above, according to the present invention, as the water-containing gas supply section is connected to the process chamber of the impurity processing apparatus or the flow path of the impurity-containing gas, and a plasma generating means is also provided in the process chamber in a space between the introduction port of the water-containing gas and the substrate, or the flow path of the impurity-containing gas, after the impurity doping using the impurity containing gas of boron, etc. or the plasma process of film formation, etc., it is possible to clean the interior of the process chamber, etc., by the plasma of the water-containing gas.

The water-containing gas is used as a cleaning gas instead of a simple elemental substance such as hydrogen, argon or the like, whereby it is possible to remove products or residues containing impurities within a short period of time without damaging the surface of the semiconductor substrate or the inner wall of the process chamber, etc.

What is claimed is:

1. An impurity processing apparatus, comprising:
   (a) an impurity-containing gas source for supplying an impurity-containing gas including at least one element or compound thereof selected from the group consisting of phosphorus, boron, antimony, arsenic, gallium, aluminum, and germanium;
   (b) a water-containing gas source for supplying a water-containing gas; and
   (c) a chamber comprising:
      (1) an introduction port for introduction of an impurity-containing gas which is connected to the impurity-containing gas source;
      (2) a substrate holder supporting a substrate which is to be ion-injected or doped using the impurity-containing gas, or on which a film is to be formed;
      (3) an introduction port, for introduction of a water-containing gas, located upstream of the substrate holder in accordance with flow direction of the impurity-containing gas, and connected only to the water-containing gas source, said water-containing gas source being the sole supply of cleaning agent connected to said chamber, and
      (4) first plasma generating means for generating a plasma of the water-containing gas in a space extending from the introduction port for the water-containing gas to the substrate holder, said plasma of water-containing gas serving as a cleaning agent for removing impurity-containing residue in said chamber.

2. An impurity processing apparatus according to claim 1, further comprising:
   second plasma generating means for converting the impurity-containing gas into a plasma.

3. An impurity processing apparatus according to claim 2, wherein
   the first plasma generating means is same as the second plasma generating means.

4. An impurity processing apparatus according to claim 1, wherein
   the first plasma generating means is means for applying a voltage to a pair of parallel plate electrodes to generate a plasma, means for generating a plasma by electron cyclotron resonance, means for generating a helicon plasma by application of an electromagnetic field from an antenna, or means for applying a voltage between a partition wall of the chamber and an electrode to generate a plasma.

5. An impurity processing apparatus according to claim 1, wherein
   the water-containing gas is water vapor or a gas in which hydrogen or argon is added to water vapor.

* * * * *